United States Patent

Lifka et al.

(10) Patent No.: US 8,664,096 B2
(45) Date of Patent: Mar. 4, 2014

(54) SUBSTRATE SHEET

(75) Inventors: Herbert Lifka, Eindhoven (NL); Renatus Hendricus Maria Sanders, Eindhoven (NL); Denny Mathew, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 13/819,829

(22) PCT Filed: Sep. 2, 2011

(86) PCT No.: PCT/IB2011/053852
§ 371 (c)(1),
(2), (4) Date: Feb. 28, 2013

(87) PCT Pub. No.: WO2012/032446
PCT Pub. Date: Mar. 15, 2012

(65) Prior Publication Data
US 2013/0157446 A1   Jun. 20, 2013

(30) Foreign Application Priority Data
Sep. 6, 2010   (EP) .................................... 10175346

(51) Int. Cl.
*H01L 51/00* (2006.01)
(52) U.S. Cl.
USPC ........................................................ 438/479
(58) Field of Classification Search
None
See application file for complete search history.

(56) References Cited

U.S. PATENT DOCUMENTS

| 3,324,014 A | 6/1967 | Modjeska |
| 6,617,541 B1 | 9/2003 | Wadman et al. |
| 2004/0234717 A1 | 11/2004 | Sheats et al. |
| 2009/0202857 A1 | 8/2009 | Kerr et al. |

FOREIGN PATENT DOCUMENTS

| DE | 19512157 C1 | 5/1996 |
| EP | 2284922 A1 | 2/2011 |
| JP | 9064514 A | 3/1997 |
| JP | 2009146640 A | 7/2009 |
| WO | 2007106362 A2 | 9/2007 |

OTHER PUBLICATIONS

F. E. Doany et al. "Laser Release Process to Obtain Freestanding Multilayer Metal-Polyimide Circuits", IBM Journal. Res. Dev., vol. 41, No. 112, Jan./Mar. 1997, pp. 151-157.

*Primary Examiner* — Seahvosh Nikmanesh

(57) ABSTRACT

The invention provides a method for producing a flexible barrier sheet (200) comprising a barrier layer (103) and metallic elements (104), said method comprising: a) providing a metallic layer (102) applied on a polymeric support layer (101), the metallic layer having a first surface (105) facing the polymeric support layer and a second surface (106) facing away from said polymeric support layer; b) providing metallic elements on the second surface of the metallic layer; c) providing a barrier layer covering said second surface of the metallic layer and said metallic elements, the barrier layer having a first surface facing the metallic layer and a second surface facing away from the metallic layer; d) releasing the polymeric support layer from the metallic layer; and e) removing the metallic layer from the metallic elements and the barrier layer. The flexible barrier sheet may be used in roll-to-roll fabrication of thin film semiconductor devices requiring a high quality barrier substrate sheet, such as OLEDs.

8 Claims, 2 Drawing Sheets

SUBSTRATE SHEET

FIELD OF THE INVENTION

The present invention relates to a method for the production of substrate sheet for manufacturing of semiconductor devices, and also to layer structures used in or resulting from said method.

BACKGROUND OF THE INVENTION

Production of thin film electronic devices has developed over the years towards increasingly cost-efficient large-scale production. For mass fabrication of semiconductor devices such as organic light emitting diodes (OLEDs), electrochrome devices and photovoltaic devices, a very interesting technology is roll-to-roll processing, in which the device is built on a flexible, possibly transparent, substrate material such as a plastic sheet.

A substrate sheet to be used in mass production of e.g. OLEDs may be formed on a sacrificial metal substrate on which a metallic shunting structure and a barrier layer are applied and optionally laminated or covered with an organic coating to produce a sheet. Next, the sacrificial metal substrate is etched away to leave a self-supporting flexible substrate sheet having barrier properties and a shunting structure. A semiconductor device may then be built on the surface of the sheet which faced the sacrificial metal substrate before its removal.

However, the approach described above suffers from several disadvantages. First, aluminum sheet, which is commonly used as the sacrificial metal substrate, has a surface roughness which causes the resulting substrate sheet to have poor barrier qualities when a semiconductor device is produced thereon, thus limiting its use to fabrication of devices which do not require a high quality barrier. Furthermore, etching the metal substrate is time consuming, thus providing an obstacle to achieving more time- and cost-efficient fabrication processes.

Thus, there remains a need in the art for improved methods for low-cost mass production of thin film semiconductor devices.

SUMMARY OF THE INVENTION

It is an object of the present invention to overcome this problem, and to provide a more efficient method for producing a substrate sheet for roll-to-roll manufacturing. It is also an object of the invention to provide a substrate sheet for roll-to-roll manufacturing which has improved barrier properties.

According to a first aspect of the invention, this and other objects are achieved by a method for producing a flexible sheet comprising a barrier layer and metallic elements, intended as a substrate sheet for the manufacture of a thin film semiconductor device, said method comprising:
a) providing a metallic layer applied on a polymeric support layer, the metallic layer having a first surface facing the polymeric support layer and a second surface facing away from said polymeric support layer;
b) providing metallic elements on the second surface of the metallic layer;
c) providing a barrier layer covering said second surface of the metallic layer and said metallic elements, the barrier layer having a first surface facing the metallic layer and a second surface facing away from the metallic layer;
d) releasing the polymeric support layer from the metallic layer; and
e) removing the metallic layer from the metallic elements and the barrier layer.

The present inventors found that by using a self-supporting polymeric layer coated with a relatively thin metallic layer as a support for forming the flexible sheet, a flexible sheet having improved barrier qualities can be obtained. Since the polymeric support layer is very smooth, the metallic layer also becomes very smooth, compared to the surface of a conventional rolled metal foil. As a result of the smooth metallic layer, the first surface of the barrier layer also becomes very smooth (smoother than a barrier layer applied on a conventional rolled metal foil), thus providing a better barrier.

Furthermore, since the polymeric support layer is removed in a first step, and the metallic layer may be very thin compared to a conventional rolled metal foil, only little etching is required to remove the metallic layer. Hence, the etching step is less time-consuming than conventional methods and also uses less etchant, which is advantageous from an environmental as well as an economical point of view.

In embodiments of the invention, releasing the polymeric support layer from the metallic layer is achieved by heating the metallic layer. Hence, heat may be transferred to the polymeric support layer which may delaminate. Typically, the metallic layer has a melting temperature which is higher than the evaporation temperature of the polymeric support layer, and the metallic layer is heated to a temperature which is equal to or higher than the evaporation temperature of the polymeric support layer, but lower than the melting temperature of the metallic layer. Preferably, releasing the polymeric support layer from the metallic layer is performed using a laser. The laser typically heats the metallic layer.

In embodiments of the invention, the metallic layer may be removed by etching.

According to embodiments of the invention, the method may further comprise the step of:
f) providing a semiconductor device or material on the first surface of the barrier layer and the metallic elements.
This step is generally performed in a roll-to-roll manufacturing process, which is a very convenient and cost-effective way of mass producing thin film devices.

In another aspect, the present invention provides a layer structure comprising: a metallic layer sandwiched between a polymeric support layer and a substrate sheet comprising metallic elements, wherein a first surface of the metallic layer faces the polymeric support layer, and a second surface of the metallic layer faces a first surface of the substrate sheet, the metallic elements of the substrate sheet being in contact with said second surface of the metallic layer. Typically the substrate sheet comprises a barrier layer. By using a polymeric layer and a metallic layer coated thereon instead of a conventional rolled metal foil as a support for forming the metallic elements and the barrier layer (intended to form a flexible barrier sheet), the barrier qualities of the barrier layer are improved, thus enabling roll-to-roll fabrication of thin film devices requiring a high quality barrier sheet, such as OLEDs.

In embodiments of the invention, the polymeric support layer comprises polyimide. Also, typically, the metallic layer may comprise aluminum. The metallic layer is thin compared to the polymeric support layer, and may have a thickness in the range of 0.02 to 100 μm. On the contrary, the polymeric support layer may have a thickness of from 5 to 500 μm.

Typically, the metallic elements of the substrate sheet may be intended to provide a shunting structure for the final thin film (e.g. OLED) device.

In a further aspect, the present invention provides a method for fabrication of a thin film device, comprising: providing a flexible substrate sheet obtained by the method according to the first aspect of the invention; and using said flexible substrate sheet in a roll-to-roll fabrication process. Hence, according to a further aspect of the invention a flexible substrate sheet obtained by the method according to the first aspect of the invention may be used in a process for fabricating a thin film device.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention.

DETAILED DESCRIPTION

Figure 1A:
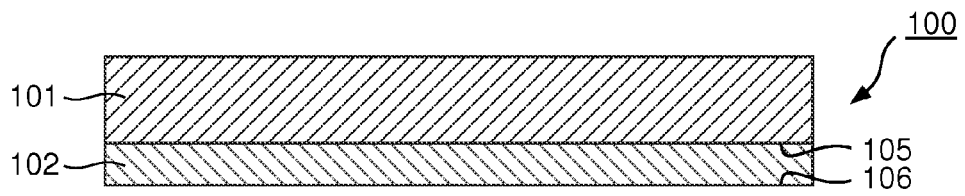
FIG. 1a-e schematically illustrate the method according to embodiments of the invention.
Figure 1B:
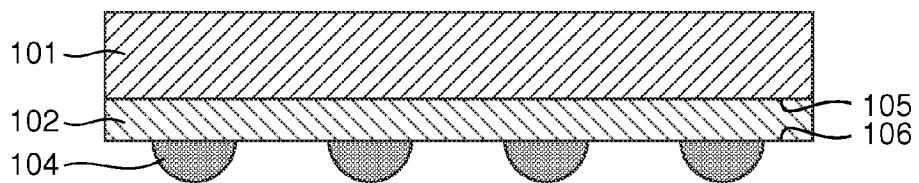

The present inventors found that replacing the thick metal sheet used for conventional fabrication of the barrier sheet for roll-to-roll processing, with a sacrificial layer stack comprising a polymeric support layer coated with a thin metallic layer resulted in several advantages, including improved barrier qualities of the final thin film device, and a more efficient production process.

The method according to the present invention is schematically depicted in FIG. 1. First, a layer structure or stack 100 comprising a polymeric support layer 101 and a metallic layer 102 is provided (step a; FIG. 1a). Next, metallic elements 104 which are intended to form a shunting structure in the final device are formed on the metallic layer (step b; FIG. 1b). A barrier layer 103, typically a polymeric barrier layer, is then applied by known techniques in contact with and to cover the metallic elements 104 and the surface 106 of the metallic layer exposed between the metallic elements (step c; FIG. 1c). Next, in order to produce a self-supporting, flexible barrier sheet, laser-assisted delamination is used to release the polymeric support layer 101 from the metallic layer 102 (step d; FIG. 1d), and subsequently the metallic layer 102 is removed from the barrier layer 103 and the metallic elements 104 by conventional etching (step e; FIG. 1e). The resulting barrier sheet 200, comprising the barrier layer and the metallic elements but not the polymeric support layer 101 and the metallic layer 102, may be used in roll-to-roll processing for the fabrication of thin film semiconductor devices, such as OLEDs. The respective steps a-e of the inventive method will be described in more detail below.

The polymeric support layer and the metallic layer may be produced by well-known techniques. The metallic layer may be deposited as a coating on the polymeric support layer, e.g. by sputtering. Optionally, after deposition, the metallic layer may be made thicker by electroplating, for example ionic liquid electroplating in the case of an aluminum layer. A thickened metallic layer may be desirable in order to protect the layers underneath the metallic layer (facing away from the sacrificial polymer layer) from heat.

The polymeric support layer 101 that is used according to the invention for replacing part of the conventional, thick aluminum sheet may be formed of any suitable polymeric material susceptible of laser-assisted delamination from a metallic layer, examples including polyimide, temperature stabilized poly(ethylene tepephthalate) (PET), poly(ethylene naphthalate) (PEN) and polyether ether ketone (PEEK). Preferably the polymeric support layer comprises polyimide, and more preferably is a polyimide layer. Polyimide is preferred because of its high temperature stability.

The metallic layer 102 may be a metal or alloy, preferably a soft metal or alloy having a relatively low melting point, such as aluminum.

The metallic layer 102 is thin relative to the polymeric support layer 101. For example, the thickness of the metallic layer may be in the range of from 0.02 to 100 μm, for example about 1 μm. On the other hand, the polymeric support layer typically has a thickness in the range of 5 to 500 μm, for example about 100 μm.

As is illustrated in the Figures, the metallic layer 102 has a first surface 105 which faces and is in direct contact with the polymeric support layer 101. The metallic layer is also in direct thermal contact with the polymeric support layer, such that heat may be transferred from the metallic layer to the polymeric support layer via the surface 105 of the metallic layer.

Further, the metallic layer 102 also has a second surface 106 which faces away from the polymeric support layer and on which the metallic elements 104 may be applied. The elements 104 may be formed on the metallic layer using a conventional technique, e.g. by deposition of conductive ink which is cured. The function of the metallic elements 104 in the resulting sheet 200 is to provide in the final device a conductive and shunting structure, which provides electrical current and good voltage distribution across a transparent electrode that is to be arranged on the sheet 200. The metallic elements 104 may include thin shunting lines of metal having width and height dimensions in the range of about 0.5 μm to 100 μm and optionally also larger busbars. The shunting lines and optionally the busbars may form any pattern on the metallic layer, for example a grid pattern.

Figure 1C:
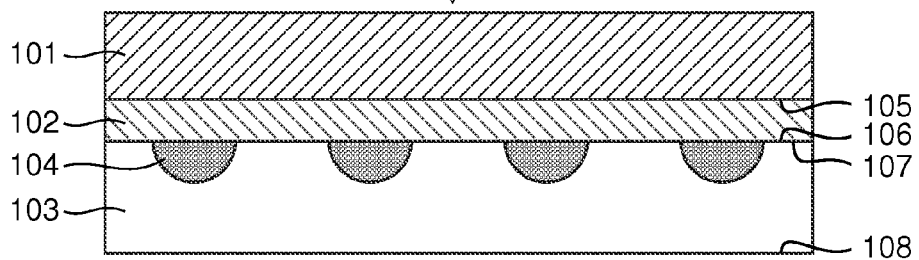
Figure 1D:
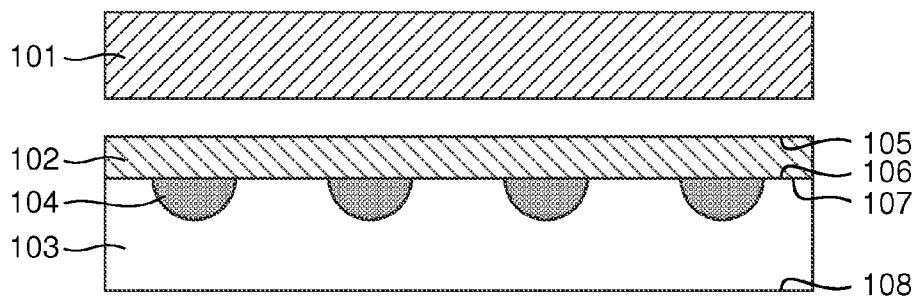
Figure 1E:
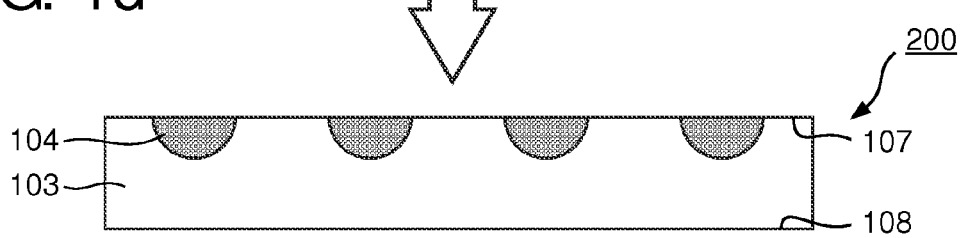

After forming the metallic elements, the metallic layer and the metallic elements are covered by a barrier layer 103, which typically is a polymeric barrier layer. The barrier layer 103 has a first surface 107 which faces and is in direct contact with the metallic elements 104 and the second surface 106 of the metallic layer 103. Thus, the layer structure illustrated in FIG. 1c is obtained. The surface of the barrier layer facing away from the sacrificial layers and the metallic elements is denoted 108.

The polymeric support layer 101 and the metallic layer 102 are sacrificial layers, meaning that they are provided only to assist the formation of other layers or structures and are disposed of after fulfilling this object. The purpose of the polymeric support layer and the metallic layer is to provide a supporting surface for forming a barrier layer 103 having a smooth surface comprising the metallic elements 104. The polymeric support layer and the metallic layer are then removed as part of the process of producing the flexible sheet that is to be used for roll-to-roll processing.

Figure 2A:
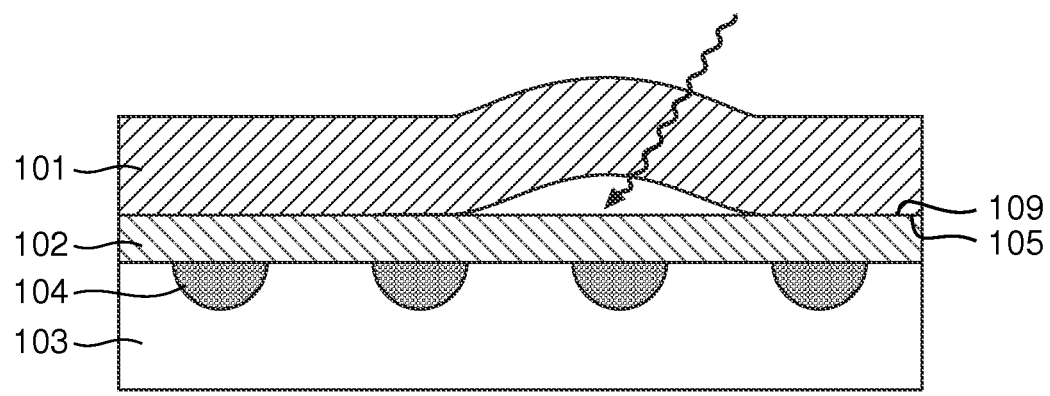
FIGS. 2a and 2b each schematically illustrate releasing the polymeric support layer from the metal layer.
Figure 2B:
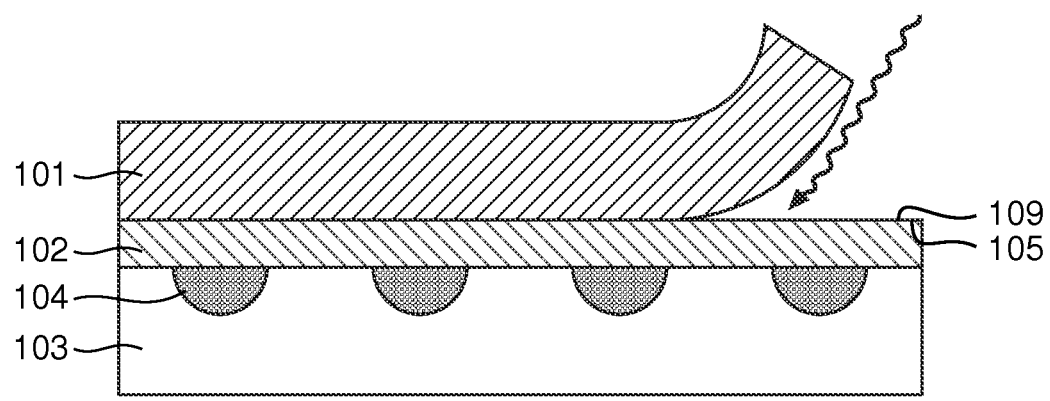

The polymeric support layer 101 may be firmly adhering to the metallic layer. However, the present inventors have found that the polymeric support layer may be removed from the metallic layer by laser-assisted delamination, without damage to other layers or structures of the layer assembly, by using a laser beam to heat the metallic layer, thus heating indirectly the polymeric layer to a delamination temperature which is above the evaporation temperature of the polymeric layer. As part of the material of the polymeric support layer evaporates at the surface 109 thereof facing the metallic layer, the polymeric support layer delaminates from the metallic layer. By continuously moving the laser beam along the layer assembly, a delaminated line is created (shown in cross-section in FIG. 2a). A plurality of essentially parallel delaminated lines can be made, which may achieve complete delamination of the entire polymeric support layer. FIG. 2b illustrates complete delamination of a continuous part of the polymeric support layer.

Preferably, the delamination temperature used is below the melting temperature of the metal or alloy forming the metallic layer. The delamination temperature may be in the range of from 100 to 1000° C., but depends on the evaporation temperature of the material of the polymeric support layer and the melting temperature of the metallic layer, respectively. For example, for releasing a polyimide layer from an aluminum layer, the aluminum is preferably heated to a temperature in the range of from 300 to 700° C., for example about 500° C. It is contemplated however that the polymeric support layer may comprise a polymer which evaporates at such low temperature that a delamination temperature of below 100° C. is possible. For example, to achieve delamination, an infra-red fiber laser having an emission wavelength in the range of from 1050 to 1100 nm may be used.

Following removal of the polymeric support layer, the exposed metallic layer may be removed using conventional chemical etching. Since the metallic layer is thin compared to the supporting metal sheets conventionally used, the etching period required to remove the metallic layer will be shorter, and less etchant will be required. The etching time may be about 1 minute. A short etching time is advantageous not only because it saves time in the production process, but also because the exposure of the barrier layer to the etchant, which may adversely affect the barrier layer, is reduced. For etching of an aluminum layer, potassium hydroxide (KOH) may be used. However, since potassium hydroxide may also etch at a low rate the nitride barrier of a barrier layer, the function of the barrier may be compromised by long etching periods. Moreover, by using a short etching period unwanted reactions between the metallic layer and the etchant may be reduced or avoided.

The substrate sheet 200 may subsequently be used in roll-to-roll production of thin film devices. A semiconductor device may be built either on the surface 107 of the barrier layer, thus in contact with the metallic elements 104, or on the surface 108 of the barrier layer.

The person skilled in the art realizes that the present invention by no means is limited to the preferred embodiments described above. On the contrary, many modifications and variations are possible within the scope of the appended claims. For example, a transparent conductor such as a thin metal layer, ITO, AlZnO, TiF etc. could be applied on the surface 106 of the metallic layer 103, before forming the metallic elements 104, such that the barrier layer 103 may be applied in contact with and to cover the metallic elements and part of the conductor exposed between the metallic elements. In such embodiments, the etching step is adjusted such that the conductor is not substantially etched when the metallic layer 102 is removed. In yet other embodiments, a structure or device, such as a micro-electromechanical device, could be built on the surface 108 of the barrier layer facing away from the sacrificial layers before the laser-assisted release and subsequent etching of the sacrificial layers.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A method for producing a flexible sheet comprising a barrier layer and metallic elements, intended as a substrate sheet for the manufacture of a thin film semiconductor device, said method comprising:
    a) providing a metallic layer applied on a polymeric support layer, the metallic layer having a first surface facing the polymeric support layer and a second surface facing away from said polymeric support layer;
    b) providing metallic elements on the second surface of the metallic layer;
    c) providing a barrier layer covering said second surface of the metallic layer and said metallic elements, the barrier layer having a first surface facing the metallic layer and a second surface facing away from the metallic layer;
    d) releasing the polymeric support layer from the metallic layer; and
    e) removing the metallic layer from the metallic elements and the barrier layer, wherein the metallic layer has a melting temperature which is higher than the evaporation temperature of the polymeric support layer, and wherein the metallic layer is heated to a temperature which is equal to or higher than the evaporation temperature of the polymeric support layer, but lower than the melting temperature of the metallic layer.

2. A method according to claim 1, wherein releasing the polymeric support layer from the metallic layer is performed using a laser.

3. A method according to claim 1, wherein the metallic layer is removed using etching.

4. A method according to claim 1, further comprising the step of:
    f) providing a semiconductor device or material on the first surface of the barrier layer and the metallic elements.

5. A method according to claim 1, wherein the polymeric layer comprises polyimide.

6. A method according to claim 1, wherein the metallic later comprises aluminum.

7. A method to claim 1, wherein said metallic elements are intended to provide a shunting structure.

8. A method to claim 1, wherein said metallic layer has thickness in the range of 0.02 to 100 μm.

* * * * *